United States Patent [19]

Ito

[11] Patent Number: 4,758,896

[45] Date of Patent: Jul. 19, 1988

[54] 3-DIMENSIONAL INTEGRATED CIRCUIT FOR LIQUID CRYSTAL DISPLAY TV RECEIVER

[75] Inventor: Katsu Ito, Tokorozawa, Japan

[73] Assignee: Citizen Watch Co., Ltd., Tokyo, Japan

[21] Appl. No.: 939,876

[22] Filed: Dec. 9, 1986

[30] Foreign Application Priority Data

Dec. 10, 1985 [JP] Japan .............................. 60-277617
Jan. 10, 1986 [JP] Japan .............................. 61-003140

[51] Int. Cl.$^4$ ........................................ H04N 3/14
[52] U.S. Cl. ................................ 358/236; 358/241; 340/719; 357/23.7
[58] Field of Search ............... 358/236, 241; 340/719, 340/718, 783; 357/23.7

[56] References Cited

U.S. PATENT DOCUMENTS

| | | | |
|---|---|---|---|
| 3,824,003 | 7/1974 | Koda et al. | 358/236 X |
| 4,169,746 | 10/1979 | Ipri et al. | 357/23.7 X |
| 4,489,478 | 12/1984 | Sakurai | 357/23.7 X |
| 4,582,395 | 4/1986 | Morozumi | 357/23.7 X |
| 4,644,338 | 2/1987 | Aoki et al. | 340/719 |
| 4,667,187 | 5/1987 | den Boer et al. | 340/718 X |
| 4,678,282 | 7/1987 | Yaniv et al. | 357/23.7 X |
| 4,686,553 | 8/1987 | Possin | 357/23.7 |
| 4,687,298 | 8/1987 | Aoki et al. | 357/23.7 X |
| 4,694,347 | 9/1987 | Ito | 358/241 X |
| 4,698,627 | 10/1987 | den Boer et al. | 340/719 X |

FOREIGN PATENT DOCUMENTS 0161555  11/1985  European Pat. Off. ........... 357/23.7

OTHER PUBLICATIONS

Sheffield Easton, "Sapphire Brings Out the Best in C-MOS", Jun. 12, 1975, pp. 115–120.
E. W. Greeneich, "Thin-Film Video Scanner and Driver Circuit for Solid-State Flat Panel Displays", 1976, pp. 16–19.
Snell et al., "Application of Amorphous Silicon Field Effect Transistors in Addressable Liquid Crystal Display Panels", 1980, pp. 358–362.
Yamano et al., "The 5-Inch Size Full Color Liquid Crystal Television Addressed by Amophorus Silicon Thin Film Transistors", 1984, pp. 39–46.
"Electronic Material", pp. 36, 38, 40, 42, and 142.

Primary Examiner—Edward L. Coles, Sr.
Assistant Examiner—E. Anne Faris
Attorney, Agent, or Firm—Lowe, Price, LeBlanc, Becker & Shur

[57] ABSTRACT

A multi-layer integrated circuit having through-hole inter-layer connections includes an integrally formed liquid crystal display panel, and performs all receiving, amplifying and video display functions of a TV receiver when connected to an antenna. Shield layers are incorporated to prevent transmission of interference from a display drive section of the integrated circuit to the antenna or the input stage of an I.F. amplifier section, and to prevent interference between the local oscillator of a tuner section and the I.F. amplifier.

32 Claims, 4 Drawing Sheets

3-DIMENSIONAL INTEGRATED CIRCUIT FOR LIQUID CRYSTAL DISPLAY TV RECEIVER

BACKGROUND OF THE INVENTION

The present invention relates to an integrated circuit whereby the signal receiving circuits and display drive circuits of a miniature television receiver can be configured into a single unit which includes an integral liquid crystal display panel.

Ultra-miniature television (abbreviated hereinafter to TV) receivers employing a liquid crystal display are becoming increasingly compact, and the market demand for such receivers is expanding rapidly. A liquid crystal display TV receiver of this type includes an antenna and a tuner unit which is operable to select TV signal channels from signals picked up by the antenna, the tuner unit basically consisting of a local oscillator circuit and a mixer for performing frequency conversion of the antenna signal to an intermediate frequency (I.F.) signal. The receiver further includes an I.F. amplifier circuit for amplifying this signal, a video signal circuit for detecting and amplifying a video signal component of the amplified I.F. signal, and an audio signal circuit for detecting and amplifying an audio signal component of the I.F. signal. All of these circuits are of analog type. The receiver also includes a liquid crystal display panel and a liquid crystal display drive circuit for generating digital signals to drive the liquid crystal display panel to display video data contained in the video signal component. The liquid crystal display panel can be of passive type, i.e. consisting only of a matrix array of liquid crystal display elements, or can be of active type, i.e. in which each of the liquid crystal display elements is coupled to an individual control element such as a thin-film transistor functioning as a switch. It is possible for the techniques employed to manufacture such a miniature liquid crystal display TV receiver to be modified for manufacturing miniature display terminals, for computers or other data-processing apparatus. Thus, the field of future applications for such devices is extremely wide.

With prior art types of miniature liquid crystal display TV receivers, the analog receiving circuit section is formed of discrete components mounted on a printed circuit board or upon a ceramic substrate, and is enclosed within a metal case. These discrete components generally include an electronic tuner unit (i.e. in which channel selection is executed by variation of a bias voltage), an I.F. signal integrated circuit for I.F. amplification, an audio signal integrated circuit, a video signal integrated circuit, and various types of filters, transistors, diodes, capacitors, coils, etc., which are individually mounted as separate components upon a printed circuit board or ceramic substrate. Similarly the liquid crystal display drive circuit is generally configured as an integrated circuit, together with associated transistors, diodes, capacitors, etc., all of which are individually mounted on a printed circuit board. This circuit produces drive signals for a liquid crystal display panel.

There is an increasing trend towards making such liquid crystal display TV receivers increasingly thin and compact. However if it is attempted to achieve this by further miniaturizing the individual components of the receiver, the result will be deterioration of the electrical performance of the components, together with increased manufacturing cost. Furthermore if the components are mounted on the printed circuit board with an excessively high degree of component density, in order to achieve greater compactness, then this will lead to problems with regard to automatic component mounting during manufacture, and problems with respect to adjustment of the receiver after mounting has been completed. In addition, such increased component density will result in a higher density of formation of connecting leads which are patterned upon the printed circuit board or ceramic substrate, i.e. the connecting leads must be made of decreased width or with decreased inter-lead spacing. This leads to problems resulting from factors such as electrostatic and electromagnetic coupling, and also lowers the performance and reliability of the printed circuit board. For these reasons, it is not practicable to achieve any substantial advances towards greater compactness of miniature liquid crystal display TV receivers by modification of the conventional configuration.

The present invention relates to an integrated circuit for implementing the signal receiving and display drive functions of a TV receiver, having a plurality of layers of active circuit elements such as transistors etc., with specific elements in different layers being mutually interconnected by means of through-hole connections formed between, and in some cases passing through, various layers. With such an integrated circuit, which will be referred to hereinafter as a 3-dimensional integrated circuit, the wiring interconnections between circuit elements are implemented in three dimensions, rather than two dimensions as in the case of a conventional type of integrated circuit. Such an integrated circuit includes a plurality of vertically superimposed layers of semiconductor material (each having active circuit elements such as transistors and generally also having passive circuit elements such as resistors etc. formed therein, together with connecting leads) which are mutually separated by layers of electrically insulating material, and has a number of advantages over a conventional two-dimensional integrated circuit. These can be summarized as follows:

(1) A high level of component density becomes practicable, with a greater degree of integration.
(2) Increased operating speed is made possible.
(3) Parallel processing of data is facilitated
(4) A multiplicity of functions can be readily implemented.

Advantage (1) above is a direct result of the multilayer configuration of the integrated circuit. For example if there are 10 semiconductor material layers in which are formed active circuit elements such as transistors (each of such layers being referred to hereinafter as an active semiconductor layer), then the level of integration can be considered to be ten times greater than that of a 2-dimensional integrated circuit. Furthermore it is generally unnecessary to provide individual input and output circuits (which have relatively high power consumption) in each of the circuit layers. As a result, the level of power consumption of a 3-dimensional integrated circuit can be made substantially lower than that of a 2-dimensional integrated circuit.

Advantage (2) above results from the fact that signal transmission delays, determined by connecting lead lengths, can be significantly reduced. In the case of a 2-dimensional integrated circuit the lengths of connecting leads will generally increase in proportion to the size of the integrated circuit, with corresponding increases in lead resistance. However with a 3-dimensional integrated circuit, through-hole connecting leads can be provided between the various layers, i.e. connecting leads which pass through the insulating layers between the active semiconductor layers. With a 2-dimensional integrated circuit, the connecting lead lengths may be as long as several millimeters. However in the case of a 3-dimensional integrated circuit, the maximum connecting lead length (between the uppermost and lowermost semiconductor layers) can be held to several micronmeters. Furthermore in the case of a 3-dimensional integrated circuit, circuit elements are formed upon an insulating film, and as a result the amount of self-capacitance of each component is smaller than in the case of a 2-dimensional integrated circuit. This leads to inherently higher operating speed capabilities for the circuit components.

With regard to advantage (3) above, it will be apparent that a 3-dimensional integrated circuit enables parallel data processing to be readily implemented. It is possible to provide several thousand or even several tens of thousands of through-hole connecting leads, for simultaneously transferring data between upper and lower layers of a 3-dimensional integrated circuit.

In the case of advantage (4) above, it is possible to arrange that each of the active semiconductor layers performs an independent function, or to arrange that specific groups of layers respectively function as units for executing specific functions.

However various problems arise if the use of a prior art type of 3-dimensional integrated circuit is envisaged for implementing all of the functions of a miniature liquid crystal display TV receiver within a single unit. One of these problems is that of providing the tuner section of the receiver. Since the tuner section must process signal frequencies which are extremely high (i.e. in the UHF and VHF bands), the circuit elements such as transistors and diodes etc. of that section must be capable of satisfactory operation at very high frequencies. It is advantageous to employ polycrystalline silicon layer to form the active semiconductor layers of a 3-dimensional integrated circuit, since this material can be easily deposited at a relatively low processing temperature. This reduces the danger of damage to circuit elements within underlying layers, as a result of heat transmission down through the layers, and also the danger of structural damage due to non-uniform heating of the substrate (since there will inevitably be localized differences in thickness within each of the semiconductor layers). However due to the low level of electron mobility within polycrystalline silicon, the material is not suitable for forming circuit elements which are to operate at high frequencies, such as active elements of a TV tuner unit or an I.F. amplifier. One method of forming a semiconductor layer in which active elements such as transistors can be formed which will be capable of high-frequency operation, in a 3-dimensional integrated circuit, is to initially form a layer of polycrystalline silicon layer, and to then irradiate that layer with an electron beam or laser beam for thereby heating the layer to a sufficiently high temperature (i.e. 1400° C.) to melt the silicon. Recrystallization then occurs, to produce an epitaxial layer of silicon, which is employed as an active semiconductor layer. This irradiation is performed for only a very brief time, e.g. several milliseconds, so that the amount of heat which is transmitted to underlying layers of the integrated circuit can be made negligible, and no adverse effects need result. The epitaxial layer thus formed can then be appropriately doped in specific regions, to configure active elements such as transistors etc.

However with the technology which is utilized at present for such recrystallization processing of polycrystalline silicon, no layer of seed crystal is provided below that silicon layer, for controlling the direction of the preferred crystal axis (the 110 axis) of the epitaxial layer which is formed. Due to this, the direction of orientation of this crystal axis in the epitaxial layer which is formed by recrystallization processing will not be uniform throughout that layer, i.e. localized variations in the axis direction will occur throughout the layer. These difference result from the fact that the direction of the crystal axis in a region of the epitaxial layer is affected by the direction of that axis within the corresponding portion of the polycrystalline layer from which the epitaxial layer was formed. This leads to localized differences in electron mobility within that layer of the wafer in which the integrated circuits are formed. These variations in electron mobility are especially liable to occur in the upper layers of a multi-layer integrated circuit, and in addition the overall level of electron mobility within such an epitaxial layer may vary between different integrated circuits. Furthermore, the various active semiconductor layers of a 3-dimensional integrated circuit are mutually separated by layers of an insulating material which is non-crystalline, (generally silicon dioxide). The surface of such a layer of insulating material will not be precisely flat, and the amount of departure from flatness will increase as the number of circuit layers is increased. This further tends to produce non-uniformity of the crystal axis orientation, i.e. formation of a recrystallized epitaxial silicon layer upon a surface which is not perfectly flat will lead to greater degrees of localized variations in electron mobility within the layer, causing substantial non-uniformity of device characteristics of circuit elements such as transistors which are subsequently formed in that layer, and unsatisfactory performance of these elements at very high frequencis of operation. For this reason, it is difficult to form circuit elements which must function at very high frequencies, e.g. elements of a TV tuner section, by using such a recrystallized epitaxial silicon layer in a 3-dimensional integrated circuit.

Another difficulty which arises with respect to employing a 3-dimensional integrated circuit to form a unit liquid crystal display TV receiver is that the drive circuit of the liquid crystal display panel produces drive pulses which are of substantial amplitude and which contain substantial high-frequency components. As a result, electromagnetic radiation is generated by this drive circuit, which can leak into the high-gain input stages of the tuner (i.e. from the antenna) or the I.F. amplifier circuit. The resultant interference will produce severe adverse effects upon picture and sound quality of the TV receiver. Since in a 3-dimensional integrated circuit all of the semiconductor layers in which the various circuits are formed are in extremely close proximity, this is a very severe problem with respect to producing a practical liquid crystal display TV receiver as a single integrated circuit. In the case of a conventional miniature liquid crystal display TV receiver, this problem is avoided by enclosing the receiver circuits in a metallic case, and by providing sufficient physical separation between the liquid crystal display drive circuit and the input stages of the tuner and I.F. amplifier circuits.

SUMMARY OF THE INVENTION

It is an objective of the present invention to overcome the problems described hereinabove which arise with regard to implementing a 3-dimensional integrated circuit, and to provide a 3-dimensiional integrated circuit whereby substantially all of the receiving and display functions of a miniature TV receiver are integrated into a single unit including an integrally formed liquid crystal display panel.

To attain this objective, an integrated circuit according to the present invention essentially comprises:

a substrate;

a plurality of layers of semiconductor material successively formed upon the substrate, each of the layers having a plurality of active and passive circuit elements formed therein;

a plurality of layers of electrically insulating material respectively formed between mutually adjacent ones of the semiconductor layers;

through-hole connecting means for interconnecting predetermined ones of the circuit elements formed in respectively different ones of the semiconductor layers, and;

a liquid crystal display panel formed integrally upon the integrated circuit;

the circuit elements of a first set of the semiconductor layers being interconnected to constitute a receiver circuit block for receiving a television signal and producing video and audio signals therefrom, and the circuit elements of a second set of the semiconductor layers being interconnected to constitute a display drive block coupled to receive the video signal, for producing liquid crystal display drive signals, the liquid crystal display drive signals being applied to the liquid crystal display panel to thereby produce a television image.

More specifically, a 3-dimensional integrated circuit according to the present invention is basically divided into a receiving circuit block consisting of a set of successively superimposed semiconductor layers in which signal receiving functions are performed, these semiconductor layers being mutually separated by insulating layers, and a display drive block consisting of a set of successively superimposed semiconductor layers in which liquid crystal display panel drive functions are performed. The receiving circuit block preferably extends upward from the substrate, and the display drive block is formed upon the receiving circuit block and is separated therefrom by a shielding layer, formed of an electrically conductive material. The liquid crystal display panel is formed upon the uppermost layer of the display drive block. The receiving circuit block includes a lower semiconductor layer in which is formed a tuner circuit, and an upper semiconductor layer in which is formed an I.F. amplifier circuit, and video and audio signal circuits for respectively producing demodulated video and audio signals. These upper and lower sets of layers of the receiving circuit block are mutually separated by a shielding layer formed of an electrically conductive material.

To ensure satisfactory high-frequency performance for the tuner circuit, this is preferably formed in a semiconductor layer which is formed directly upon or closely adjacent to a surface of the substrate, that surface being formed accurately flat with a high degree of precision. Excellent high-frequency performance for the circuit elements of the tuner circuit can be attained by employing a layer of a suitable compound material, such as gallium arsenide, for the semiconductor layer in which the tuner circuit is formed.

BRIEF DESCRIPTION OF THE DRAWINGS

FIG. 2 is a simplified block circuit diagram to illustrate paths whereby interference produced by a liquid crystal display drive circuit can enter the antenna and amplifier input stages of a miniature TV receiver;

DESCRIPTION OF THE PREFERRED EMBODIMENTS

Figure 1:
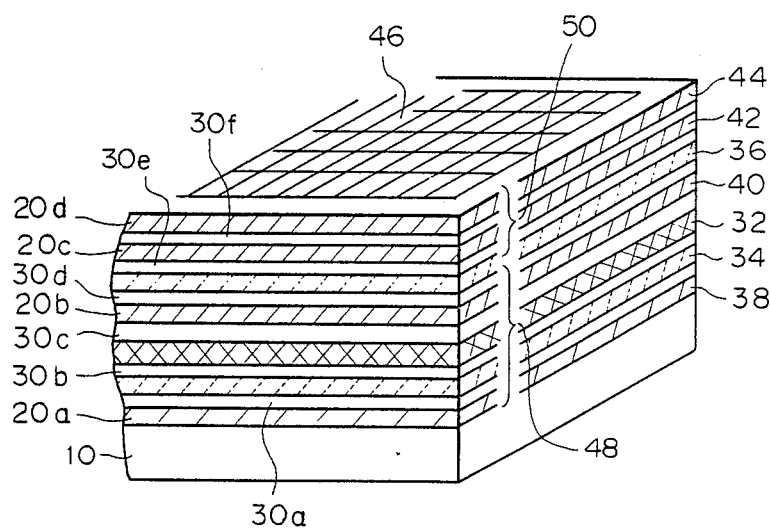
FIG. 1 is a partial external oblique view of an embodiment of a 3-dimensional integrated circuit for a liquid crystal display TV receiver according to the present invention.

FIG. 1 shows a partial oblique view of an embodiment of a 3-dimensional integrated circuit for a liquid crystal display TV receiver according to the present invention. The integrated circuit is formed on a substrate 10 which is formed of an electrically insulating material, upon which are successively formed a plurality of active semiconductor layers 20a, 20b, 20c and 20d, and an acoustic surface wave element layer 32 together with shield layers 34 and 36, these layers being mutually separated by thin films 30a to 30f formed of an electrically insulating material, which in this embodiment is silicon dioxide. The semiconductor material in each of the active semiconductor layers is silicon, in this embodiment. The lowest active semiconductor layer 20a is formed directly upon substrate 10, and serves to constitute a tuner circuit 38 of the TV receiver. An insulating film 30a is formed over active semiconductor layer 20a, and a shield layer 34 consisting of an electrically conductive material is formed over this insulating film 30a, with another insulating film 30b being formed upon shield layer 34. The acoustic surface wave element layer 32 is formed upon the insulating film 30b, and another insulating film 30c formed thereon. A second active semiconductor layer 20b is formed upon insulating film 30c. The I.F. amplifier and the video and audio demodulation and amplifier circuits of the TV receiver, collectively denoted by numeral 40 and collectively referred to hereinafter for brevity of description as the video/audio signal processing circuit, are formed in active semiconductor layer 20b. An insulating film 30d is formed upon active semiconductor layer 20b, and a shield layer 36 consisting of an electrically conductive material is formed over insulating film 30d. An insulating film 30e is formed upon shield layer 36, and a third active semiconductor layer 20c is formed upon insulating film 30e. Drive circuits 42 for driving a liquid crystal display panel of the TV receiver are formed in active semiconductor layer 20c. An insulating film 30f is formed over active semiconductor layer 20c, and a fourth active semiconductor layer 20d is formed upon insulating film 30c. In this embodiment the liquid crystal display panel is of active-matrix type, with each of the liquid crystal display elements being coupled to a corresponding active semiconductor control element, i.e. a transistor functioning as a switch. An array 44 of these display control elements is formed in the uppermost active semiconductor layer 20d, together with liquid crystal display element drive electrodes. A liquid crystal display panel 46 is formed directly upon active semiconductor layer 20d. The configuration of such a liquid crystal display panel is well known in the art, and detailed description of the panel will be omitted from the following.

The set of layers 20a to 30d, i.e. which contain the video/audio signal processing circuit 40 and the tuner circuit 38, will be designated as receiving circuit block 48. The set of layers 30e to 46, which contain liquid crystal display panel drive circuit 42 and the display control elements 44, will be designated as display drive block 50. The respective layers within the receiving circuit block 48 and display drive block 50 are mutually interconnected as required by means of through-hole connecting leads, as described hereinafter.

A major problem which has arisen with prior art types of 3-dimensional integrated circuit is that of non-uniformity of the characteristics of active elements such as transistors, within the active semiconductor layers, which makes it difficult to produce a suitable tuner circuit for a TV receiver in such a layer. It is essential that the active elements of a tuner circuit have a good performance in the VHF and UHF ranges, and hence must be formed of semiconductor material having a high degree of electron mobility, which is predictably uniform between the various elements. In the case of the present embodiment, the semiconductor layer 20a is formed from an epitaxial layer of silicon which is deposited directly upon the substrate 10. This epitaxial layer is formed by initially depositing a layer of polycrystalline silicon, then performing recrystallization of that layer by melting the layer, through the application of a laser beam or electron beam. Since this epitaxial silicon layer is not formed upon a seed crystal layer, in this embodiment, localized variations in the orientation of the main crystal axis will occur within that layer. This results in corresponding localized variations in electron mobility within the layer. These localized variations are made more severe if the semiconductor layer processed in this way has been formed upon a number of other previously formed layers, and hence is not formed upon a perfectly flat surface. For this reason, the tuner circuit in a 3-dimensional integrated circuit for a TV receiver according to the present invention is preferably formed in the lowest of the semiconductor layers, i.e. in a layer which lies directly upon the substrate, or closely adjacent to the substrate. Furthermore, the substrate should be very accurately formed with a precisely flat surface. In this embodiment therefore active semiconductor layer 20a, containing tuner circuit 38, is formed directly upon substrate 10. The localized variations in electron mobility referred to above are at a minimum within an epitaxial layer of recrystallized silicon which is formed directly upon an extremely flat substrate surface, and hence it becomes possible to form active elements such as transistors within that recrystallized layer which have satisfactory performance for operation in the UHF and VHF bands. It is equally possible to form a thin film of insulating material upon substrate 10, and to form the silicon semiconductor layer 20a upon that thin film. Even in that case, the advantage of forming layer 20a upon an accurately flat surface will be substantially retained.

The substrate 10 is preferably formed of sapphire since use of this material will lead to reduced levels of parasitic capacitance associated with circuit elements in the tuner circuit 38, thereby ensuring excellent performance in the VHF and UHF frequency bands. Furthermore, use of a sapphire substrate has the advantage that when MOS FETs are formed in semiconductor layer 20a, the capacitances between the source of each transistor and substrate 10, and between the drain electrode and substrate 10, will be small. This enables high-speed operation and low power consumption to be attained for these MOS FETs. In addition, such an arrangement facilitates the formation of spiral inductors to provide concentrated inductance values for use in VHF and UHF circuit operation. Such spiral inductors can be used for example in input/output matching circuits of the FETs, or in tuned circuits. Alternatively, the self-resonance of such spiral inductors can be employed to implement high-frequency chokes. The dimensional accuracy of connecting lead patterns for such spiral inductors is an extremely important factor with regard to the electrical characteristics of the inductors. However if this connecting lead pattern is implemented by forming a layer of a metal such as aluminum or molybdenum, or a silicide compound, upon a silicon layer lying upon a sapphire substrate (i.e. on a silicon-on-sapphire or SOS layer), the pattern can be manufactured with a sufficiently high degree of dimensional accuracy.

An acoustic surface wave element functioning as a comb filter, to serve as an I.F. filter between an output terminal of the tuner circuit 38 output and an input terminal of the the I.F. amplifier circuit, is formed in the acoustic surface wave element layer 32, with the output signal produced from the tuner circuit 38 being passed through this comb filter to the input of the I.F. circuit in the video/audio signal processing circuit 40. The tuner circuit 38 is screened from the video/audio signal processing circuit 40 by means of shield layer 34, with the connection from the output of tuner circuit 38 to the comb filter in acoustic surface wave element layer 32 being accomplished by a through-hole connecting lead (described hereinafter) passing through layers 30a and 34. The acoustic surface wave element layer consists of a thin film of a piezoelectric material which is formed upon a layer of silicon serving as a substrate. The piezoelectric layer can be formed on the silicon substrate by a method such as sputtering deposition, vacuum-evaporative deposition, or a vapor deposition method.

If a surface wave is transmitted across the surface of a relatively thick plate of a piezoelectric material, then the energy of the surface wave will be concentrated within a region which extends from the latter surface of the piezoelectric plate down to a depth of approximately one wavelength of the surface travelling wave. For this reason, it is possible to utilize a thin film of piezoelectric material, deposited on a substrate formed of a non piezoelectric material, to implement a surface wave element. The thickness of this thin film should be made equal to approximately one wavelength of the surface travelling wave. In this way, the amount of piezoelectric material required to form surface wave elements can be considerably reduced, so that maunufacturing costs can be substantially lowered by comparison with the use of bulk piezoelectric material to form such elements. Furthermore by forming a surface wave element in this way, the travelling wave propogation characteristics will be determined by the mutual relationship between the characteristics of the piezoelectric thin film and the non-piezoelectric substrate. Thus, by using only one type of piezoelectric material, it is possible to alter such parameters as the travelling wave acoustic velocity, the center frequency of the surface wave element, and the temperature characteristic of the delay time of the element, merely by suitably varying the thickness of the piezoelectric thin film or by varying the type of material used for the substrate of the surface wave element. In addition, the effective electromechanical coupling factor of a comb filter which is implemented as such a surface wave element can be altered by varying the configuration of the comb electrodes or the thickness of the piezoelectric thin film. In this way an optimum value of the electro-mechanical coupling factor can be attained for a specific application. For this reason it becomes possible to attain a higher electro-mechanical coupling factor with such a piezoelectric thin film surface wave element than is possible with an element which is formed using a bulk piezoelectric substrate.

Suitable materials for the piezoelectric thin film are aluminum nitride or zinc oxide. A thin film formed from such a material displays a high surface wave velocity, and is suitable for high-frequency operation. Such a piezoelectric thin film, deposited on a silicon substrate or a layer of silicon by a process such as sputtering, can be caused to vibrate in the Rayleigh fundamental mode or in the Sezawa mode. The Sezawa mode has the advantage of providing a high value of phase velocity and a large coupling factor. It is preferable to form a layer of quartz upon the silicon layer, and form the piezoelectric thin film upon this quartz layer. This enables an improved temperature characteristic to be obtained, by suitably selecting the thickness of the quartz layer.

In the embodiment of FIG. 1, the acoustic surface wave element layer 32 is formed of a thin layer of a piezoelectric material which lies upon a layer of silicon dioxide, i.e. lies directly upon the insulating layer 30a which covers the tuner circuit layer 20a. However it would also be possible to form the tuner circuit semiconductor layer 20a upon the acoustic surface wave element layer 32, and to form the acoustic surface wave element layer upon substrate 10. In this case the thin film of piezoelectric material such as zinc oxide can be formed directly upon substrate 10, and if substrate 10 is a sapphire substrate then this arrangement will have the advantage that a higher value of phase velocity for a surface wave element formed in acoustic surface wave element layer 32. This will result in a higher acoustic velocity characteristic, and excellent coupling characteristics for such an element.

It should be noted that such a piezoelectric thin film can be utilized not only to form filter elements, but also to form vibrator elements for high-frequency operation, control elements for a voltage-control oscillator, or a frequency control element of a local oscillator circuit of a double-superheterodyne receiver circuit.

As stated, the uppermost of the active semiconductor layers, layer 20d, is used to form a matrix of switching elements to control individual display elements of the liquid crystal display panel 46. It is preferable that these elements be formed in polycrystalline silicon, since better switching characteristics can be obtained then is possible with thin-film switching elements formed in an epitaxial layer of silicon. It is therefore not necessary to convert the polycrystalline silicon of layer 20d into an epitaxial layer by recrystallization. Furthermore since layer 20d is the topmost of the active semiconductor layers, it is possible to form connecting leads in that layer from a material which has a low melting point, such as aluminum. In this way, the connecting leads between the various switching elements and the corresponding electrodes of display elements of liquid crystal display panel 46 can be formed of aluminum, as can the electrodes. These electrodes and connecting leads can thereby be formed upon the uppermost surface of the various semiconductor layers of the integrated circuit, i.e. the surface of layer 20d, and are configured to collectively function as a rear reflector for the liquid crystal display panel, to reflect incident light outward from the display panel and thereby enable an image to be displayed.

The shield layer 34, formed between the tuner circuit layer 20a and the acoustic surface wave element layer 32 serves to provide mutual isolation between the tuner circuit 38 and the I.F. amplifier circuit in video/audio signal processing circuit 40, and hence to prevent the local oscillator signal produced by a local oscillator within tuner circuit 38 from leaking into the input stages of that I.F. amplifier. Shield layer 34 also serves to prevent external radiation interference from leaking into the tuner circuit 38.

The liquid crystal display panel drive circuit 42 formed in layer 20c emits substantial amounts of electromagnetic radiation, due to the relatively large-amplitude pulses containing substantial high-frequency components (i.e. extending from DC up to several MHz) which are generated by this circuit. The shield layer 36 disposed between the display drive block 50 and the receiver circuit block 48 serves to effectively prevent such electromagnetic radiation from being transferred to the antenna of the receiver, or to the input stage of the I.F. amplifier circuit in the video/audio signal processing circuit 40, which is a very high-gain amplifier stage. The provision of shield layer 36 between the display drive block 50 and the receiving circuit block 48 is a very important feature of a 3-dimensional integrated circuit according to the present invention, and is essential for implementing a practicable TV receiver circuit in such an integrated circuit, since any pick-up by the circuits in the receiving circuit block of interference radiated from the display drive block can result in severe deterioration of the image and sound quality of the receiver. It is therefore necessary to form the liquid crystal display panel drive circuits in a block, consisting of one or more shielded layers, which is completely isolated from the receiving circuits. The most effective degree of shielding can be attained by completely surrounding each of the display drive block and the receiving circuit block with a thin metallic film.

FIG. 2 is a simplified block circuit diagram showing the overall circuit configuration of a liquid crystal display TV receiver, to illustrate the paths by which pulse noise that is radiated from the display drive block can leak into the receiver circuits. Reference numeral 52 denotes a receiver antenna, numeral 54 a tuner unit, numeral 56 an I.F. amplifier, 58 a video signal circuit, 60 an audio signal circuit, 66 a liquid crystal display panel drive circuit, and 68 a liquid crystal display panel. Numeral 51 denotes a receiving circuit block and 64 a display drive block. Input of a broadcast TV signal is indicated by numeral 62, while 70 indicates free-space electromagnetic radiation constituting pulse noise which is emitted from display drive block 64 and which induces interference in other layers of the integrated circuit. As shown, the radiated pulse noise can enter the antenna 52, or into the high-gain input stages of the I.F. amplifier circuit 56, the audio signal circuit 60 or the video signal circuit 58. This will result in a severe deteriorated of receiver performance, and adversely affect the picture and sound quality.

This danger of induced interference is the basic reason why a 3-dimensional integrated circuit according to the present invention constituting a TV receiver is divided into an upper and a lower circuit block, with a shield layer provided therebetween. The shield layer is formed of an electrically conductive thin film. The material of the film can for example consist of a semiconductor layer into which a high density of N+ or P+ carriers has been diffused. Alternatively, the shield layer can be formed of molybdenum, tungsten, or other high melting-point metal, or from a silicide compound such as molybdenum silicide. Such a shielding layer should be formed between two layers formed of an electrically insulating material.

Figure 3:
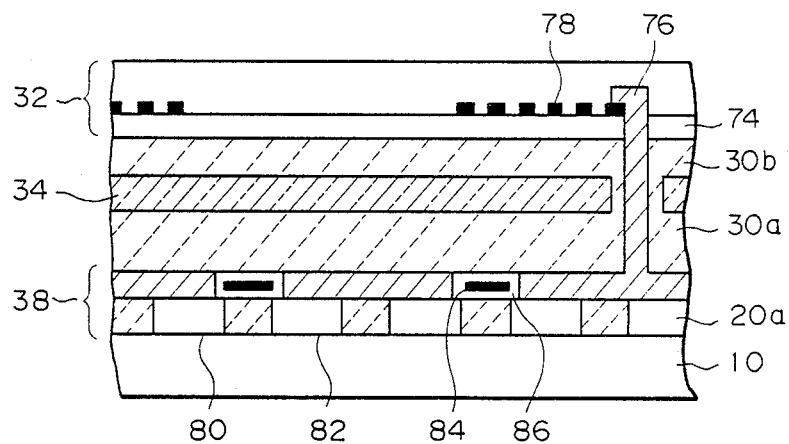
FIG. 3 is an expanded view of a region of the integrated circuit embodiment of FIG. 1, lying above and below a lower shield layer.

FIG. 3 shows a detailed partial cross-sectional view of the region of the 3-dimensional integrated circuit embodiment of FIG. 1 which lies immediately below and above the shield layer 34. Components corresponding to those of FIG. 1 are denoted by identical reference numerals. Numeral 76 denotes a through-hole connecting lead, numeral 74 a thin film of piezoelectric material which is utilized to form acoustic surface wave elements and numeral 78 a comb-shaped electrode which is an input electrode of an aooustic surface wave element functioning as an I.F. filter. Numerals 84, 82, 80 and 86 respectively denote gate, drain and source electrodes and gate insulating layers of MOS FETs formed in active semiconductor layer 20a, i.e. active elements of the tuner circuit 38.

Figure 4:
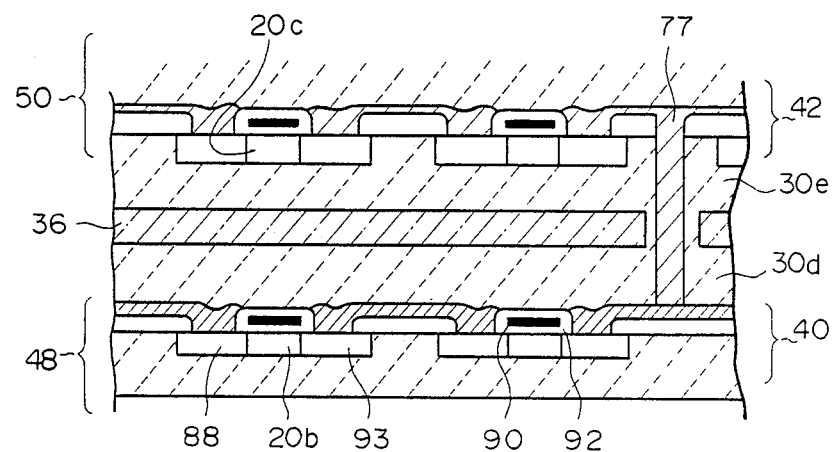
FIG. 4 is an expanded view of a region of the embodiment of FIG. 1 lying above and below an upper shield layer.

FIG. 4 is a detailed partial cross-sectional view showing a region of the embodiment of FIG. 1, lying immediately above and below shield layer 36. Components corresponding to those of FIG. 1 are denoted by identical reference numerals. Numerals 90, 93, 88 and 92 respectively denote gate, drain and source electrodes and gate insulating layers of MOS FETs formed in active semiconductor layer 20b, which form part of the video/audio signal processing circuit 40. The output signals produced from video/audio signal processing circuit 40 are transferred through through-hole connecting leads such as through-hole connecting lead 77, to the liquid crystal display panel drive circuit 42 formed in active semiconductor layer 20c.

In the embodiment of the present invention described above, the tuner circuit 38 is formed in a semiconductor layer consisting of an epitaxial layer of silicon, which has been converted into that form from polycrystalline silicon by application of laser beam or electron beam processing to execute recrystallization. However due to the extremely high frequencies which must be processed by the tuner circuit of a TV receiver, an improved high-frequency performance can be obtained for the active elements of the tuner circuit if these are formed from gallium arsenide rather than silicon. This is due to the fact that there is a higher degree of electron mobility within gallium arsenide than within silicon.

Figure 5:
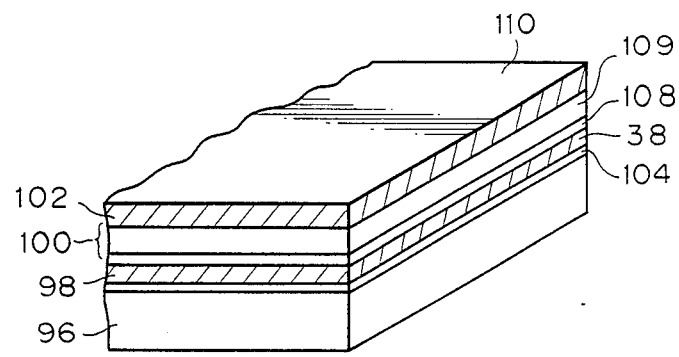
FIG. 5 is an oblique view of a portion of a second embodiment of an integrated circuit according to the present invention, employing a layer of gallium arsenide to form a tuner circuit and including a stabilized power supply circuit.

FIG. 5 is a partial view of a second embodiment of a 3-dimensional integrated circuit for a liquid crystal display TV receiver according to the present invention, in which the tuner circuit 38 is formed in an active semiconductor layer 98 consisting of gallium arsenide, rather than silicon as in the first embodiment. This embodiment of the invention further comprises an active semiconductor layer 102 consisting of a layer of polycrystalline silicon layer in which are formed circuits for producing various stabilized voltages and currents which are necessary in a practical TV receiver, such as bias voltages etc., as well as various switching elements for control of operations such as switching between U.H.F and V.H.F operation of the tuner circuit 38. It is advantageous to form all of these circuits within a single active semiconductor layer, and these circuits will be collectively referred to as the stabilized power source block 110. Polycrystalline silicon is a suitable semiconductor material for forming the circuit elements of the stabilized power source block 110, and has the advantage that it is not necessary to apply high-temperature processing to form an epitaxial silicon layer as active semiconductor layer 102, thereby simplifying the manufacturing process and reducing the danger of damage to circuit elements in the underlying layer 98 which have been previously formed. Use of polycrystalline silicon layer as a semiconductor material also has the advantage of leading to higher device reliability and a higher manufacturing yield. However it would also be possible to convert this polycrystalline silicon layer layer into single-crystal, i.e. epitaxial form, if electron beam or laser beam melting and recrystallization processing is employed, as described for the first embodiment hereinabove.

In this embodiment, the substrate 96 is preferably formed of silicon. An intermediate layer of germanium is formed between the substrate 96 and the gallium arsenide layer 98. This intermediate layer of germanium is necessary due to the differences between the lattice constants and coefficients of thermal expansion of silicon and gallium arsenide, which make it difficult to grow an epitaxial layer of gallium arsenide directly upon a silicon surface. Specifically, there is a difference of approximately 4% between the lattice constants of silicon and gallium arsenide, and there is a difference of approximately 62% between their respective coefficients of thermal expansion.

Two successive layers of insulating material, collectively designated by numeral 100, are formed upon the gallium arsenide layer 98. The lower of the insulating layers 100 consists of a strontium fluoride layer 108, while the upper layer consists of a silicon dioxide layer 109. The stabilized power source block 110 is formed in an active semiconductor layer 102 consisting of silicon, which is disposed upon the silicon dioxide layer 109, while the various layers of the acoustic surface wave element layer, the receiving circuit block and the display drive block shown in the embodiment of FIG. 5 are succesively formed over the stabilized power source block 110. It should be noted that since circuits which are formed in some of the active semiconductor layers other than layer 98 are not required to operate at extremely high frequencies, these semiconductor layers can consist of polycrystalline silicon, as in the first embodiment of the invention described above.

The germanium layer 104 is formed over substrate 96 by a process such as electron beam evaporative deposition for example, and serves as an intermediate layer between the silicon substrate 96 and the gallium arsenide layer. After forming the germanium layer 104, gallium arsenide is formed thereon, by a process such as chemical vapor deposition, to form an epitaxial gallium arsenide layer 98. This includes doped regions to form active elements such as transistors, and a tuner circuit 38 is formed therein. This gallium arsenide layer 98 is preferably formed by initially depositing upon the germanium layer a high-resistance layer of gallium arsenide which is doped with vanadium and serves as an insulating layer, and thereafter performing crystal growth of a non-doped gallium arsenide layer. It should be noted that in FIG. 5, the combination of the high-resistance gallium arsenide insulating layer and the undoped gallium arsenide layer formed thereon is designated as the active semiconductor layer 98.

Since gallium arsenide has extremely high electron mobility when used as a semiconductor material, excellent performance at very high frequencies is obtained for circuit elements in tuner circuit 38 operating in the UHF and VHF bands. An additional advantage of employing a gallium arsenide layer is that circuit elements can operate with a very low level of supply voltage, so that the overall power consumption of the TV receiver can be significantly reduced.

The layer of strontium fluoride 108 is formed as an intermediate layer between the gallium arsenide layer 98 and the silicon dioxide layer 109, and is preferably formed upon gallium arsenide layer 98 by evaporative deposition employing resistance heating. The reason for incorporation of the strontium fluoride layer is that it is difficult to form a stable silicon dioxide layer directly upon a gallium arsenide layer, due to the different physical properties of these materials. Strontium fluoride is an electrically insulating material which belongs to the hexagonal group of crystalline materials. Since the lattice constant of strontium fluoride is close to those of silicon, germanium and gallium arsenide, mutual epitaxial growth between strontium fluoride and silicon, germanium or gallium arsenide is possible. Alternatively, it is possible to grow a layer of germanium upon a silicon substrate, and to then grow an epitaxial layer of gallium arsenide upon the germanium layer.

If a layer of strontium fluoride is utilized, as in the present embodiment, it should preferably be deposited as a thin film by evaporative deposition, to a thickness of approximately 1000 angstroms or less. It is also preferable that the silicon dioxide layer 109 be formed by a chemical vapor deposition process.

In addition to providing electrical insulation, the insulating layer 100 formed of strontium fluoride layer 108 and silicon dioxide layer 109 also serves to provide thermal insulation. This is necessary due to the fact that various problems can arise if heat (i.e. that generated during the processing of circuit elements in semiconductor layers disposed above the insulating layer 100) is transferred unevenly to the substrate 96 through the active semiconductor layers 98 and 102. Such uneven thermal transfer can occur as a result of localized differences in thickness of the layers through which the heat is transmitted to the substrate. Since silicon dioxide has a low coefficient of thermal transfer, the silicon dioxide layer 109 produces a more even distribution of heat transfer to substrate 96. In addition, the insulating layer 100 serves to provide protect the circuit elements formed in active semiconductor layer 98 against the effects of heat transferred from upper layers of the I.C. during processing of these layers.

It may be possible to eliminate the germanium layer 104, and to execute crystal growth of the gallium arsenide constituting semiconductor layer 21 directly upon the silicon substrate 96, by employing a chemical vapor deposition method. This can be performed by first cleaning the surface of the substrate 96 by thermal processing, then instituting growth of a thin film of gallium arsenide upon that surface at a low temp (approximately 450° C.), and then performing growth of a gallium arsenide layer upon the latter thin film, at the normal temp for such growth (i.e. approximately 700° to 750° C.). Such a process can be utilized to form a high-quality layer of gallium arsenide.

Figure 6:
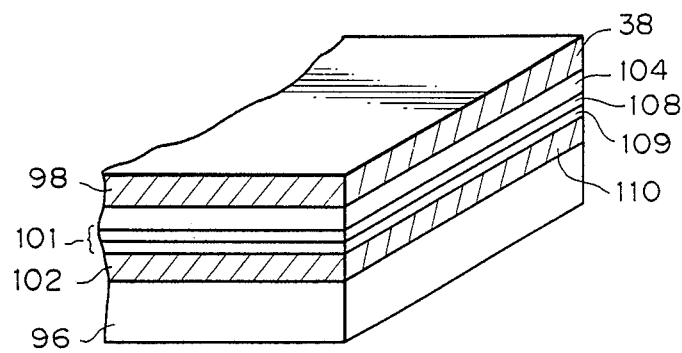
FIG. 6 is an oblique view of a portion of a third embodiment of the present invention, which is a modification of that of FIG. 5.

FIG. 6 is a partial view of the lower region of a third embodiment of a 3-dimensional integrated circuit for a liquid crystal display TV receiver, in which a gallium arsenide layer is again utilized as an active semiconductor layer in which are formed the circuit elements of the tuner circuit 38 of the receiver. In the embodiment of FIG. 6, a layer of polycrystalline silicon constituting the lowest active semiconductor layer 102 is formed directly upon substrate 96, with circuit elements of stabilized power source block 110 being formed in that layer. As in the embodiment of FIG. 5 the substrate 96 is of silicon, with the silicon semiconductor layer 102 being formed directly thereon. A silicon dioxide layer 109 is formed over the silicon active semiconductor layer 102, upon which is formed a layer of strontium fluoride 108, with layers 108 and 109 constituting an insulating layer 101. A germanium layer 104 is formed upon the strontium fluoride 108, and a gallium arsenide layer 98, utilized as an active semiconductor layer in which is formed a tuner circuit 38, is formed over germanium layer 104.

In each of the embodiments of FIGS. 5 and 6 described above, it is very important that the direction of crystal growth of the gallium arsenide constituting the active semiconductor layer 98 be carefully controlled, to produce a suitable epitaxial layer of gallium arsenide in which circuit elements such as transistors can be formed which have satisfactory high-frequency performance. The epitaxial gallium arsenide layer can be formed by either physical vapor deposition or by zone melting and recrystallization, but whichever method is utilized, it is necessary to provide a seed crystal layer upon which the germanium layer 104 is deposited, in order to control the orientation of the main crystal axis of the final gallium arsenide layer formed upon germanium layer 104. Since the germanium layer 104 in the embodiment of FIG. 6 is formed over a silicon dioxide layer 109, it is necessary to provide the layer of strontium fluoride 108 between layers 109 and 104, to serve as such a seed crystal layer. The germanium layer 104 is preferably formed upon the strontium fluoride layer by an evaporative deposition process, e.g. electron beam evaporative deposition. Recrystallization of the germanium layer to produce an epitaxial layer is then performed, for example by a band melting process employing a strip heater. The layer of gallium arsenide 98 is then formed upon the recrystallized germanium layer 104, e.g. by a chemical vapor deposition process. This enables a gallium arsenide layer having a satisfactory crystal structure to be formed.

Interconnections between circuit elements in the respective layers of the 3-dimensional integrated circuit embodiments of FIGS. 5 and 6 above are implemented as through-hole connections, as described hereinabove for the first embodiment, and further description will be omitted.

Figure 7:
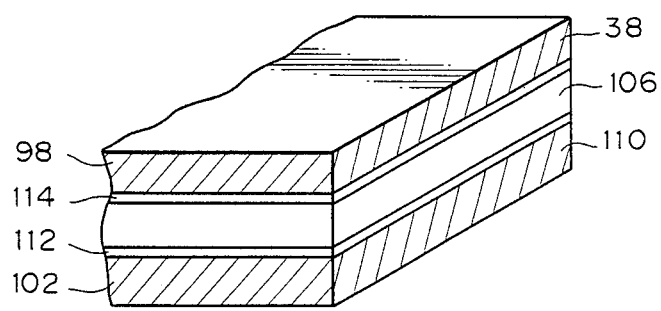
FIG. 7 is an oblique view of a portion of a fourth embodiment of the present invention, employing a layer of gallium arsenide to form a tuner circuit and including an acoustic surface wave element layer.

FIG. 7 shows an expanded view of a portion of another embodiment of the present invention in which a tuner circuit 38 is formed in a gallium arsenide layer 98 and a stabilized power supply block is formed in a silicon semiconductor layer 102. An acoustic surface wave element layer 106 is positioned between layers 98 and 102, in which one or more acoustic surface wave elements such as an I.F. comb filter are formed. The acoustic surface wave layer 106 can be formed in the manner described hereinabove for the first embodiment of the invention, and the layers 102 and 98 formed as describe above for the embodiments of FIGS. 5 and 6. Numeral 112 denotes an insulating layer, e.g. a layer of silicon dioxide, and numeral 114 a set of superimposed layers which provide electrical insulation and form a suitable surface for epitaxial growth of the gallium arsenide layer 98, as described hereinabove.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. An integrated circuit for a television receiver, comprising:
    a substrate;
    a plurality of layers of semiconductor material successively formed upon said substrate, each of said layers having a plurality of active and passive circuit elements formed therein;
    a plurality of layers of electrically insulating material respectively formed between mutually adjacent ones of said semiconductor layers;
    through-hole connecting means for interconnecting predetermined ones of said circuit elements formed in respectively different ones of said semiconductor layers, and;
    a liquid crystal display panel formed integrally upon said integrated circuit;
    said circuit elements of a first set of said semiconductor layers being interconnected to constitute a receiver circuit block for receiving a television signal and producing video and audio signals therefrom, and said circuit elements of a second set of said semiconductor layers being interconnected to constitute a display drive block coupled to receive said video signal, for producing liquid crystal display drive signals, said liquid crystal display drive signals being applied to said liquid crystal display panel to thereby produce a television image.

2. An integrated circuit according to claim 1, in which said semiconductor layers of said receiver circuit block are disposed adjacent to said substrate and said semiconductor layers of said display drive block are disposed above said receiver circuit block semiconductor layers, and further comprising a first shield layer formed of an electrically conductive material and disposed between said semiconductor layers of said receiver circuit block and said semiconductor layers of said display drive block.

3. An integrated circuit according to claim 2, in which said receiver circuit block comprises at least a first semiconductor layer in which is formed a tuner circuit and a second semiconductor layer in which is formed a video and audio signal processing circuit comprising an intermediate frequency amplifier for producing an intermediate frequency signal from an output signal of said tuner circuit and video and audio circuits for respectively deriving video and audio signals from said intermediate frequency signal, and further comprising a second shield layer formed of an electrically conductive material, disposed between said semiconductor layers of said tuner circuit and said video and audio signal processing circuit.

4. An integrated circuit according to claim 3, in which said semiconductor layers are formed from silicon.

5. An integrated circuit according to claim 4, in which said semiconductor layer of said tuner circuit comprises an epitaxial layer of silicon.

6. An integrated circuit according to claim 5, in which said epitaxial layer of silicon is formed directly upon said substrate, and in which said substrate is formed of an electrically insulating material.

7. An integrated circuit according to claim 6, in which said substrate material is sapphire.

8. An integrated circuit according to claim 5, in which said epitaxial layer of silicon is manufactured by thermal processing of a layer of polycrystalline silicon to perform recrystallization of said polycrystalline silicon layer.

9. An integrated circuit according to claim 1, in which at least one of said semiconductor layers of said display drive block comprises polycrystalline silicon.

10. An integrated circuit according to claim 3, in which said semiconductor layer of said tuner circuit comprises an epitaxial layer of a chemical compound 11. An integrated circuit according to claim 10, in which said substrate is formed of silicon.

12. An integrated circuit according to claim 10 in which said chemical compound is gallium arsenide.

13. An integrated circuit according to claim 12, and further comprising a layer of germanium upon which is formed said epitaxial layer of gallium arsenide.

14. An integrated circuit according to claim 13, in which said layer of germanium is formed directly upon said substrate, and further comprising a layer of strontium fluoride formed upon said gallium arsenide layer.

15. An integrated circuit according to claim 13, and further comprising a layer of silicon dioxide formed as one of said insulating layers, and a layer of strontium fluoride formed upon said silicon dioxide layer, with said germanium layer being formed upon said strontium fluoride layer.

16. An integrated circuit according to claim 3, and further comprising at least one semiconductor layer in which is formed at least one stabilized power supply circuit for producing a stabilized voltage or current supply.

17. An integrated circuit according to claim 16, in which said stabilized power supply circuit semiconductor layer is disposed closely adjacent to said tuner circuit semiconductor layer.

18. An integrated circuit according to claim 2, in which an electrode pattern constituting an array of drive electrodes for respective drive elements of said liquid crystal display panel is formed upon an uppermost surface of said integrated circuit.

19. An integrated circuit according to claim 18, in which said electrode pattern is configured such as to function as a rear reflector of said liquid crystal display panel for reflecting incident light outward through said liquid crystal display panel.

20. An integrated circuit according to claim 18, in which said uppermost surface is a surface of the uppermost of said successively superimposed layers of semiconductor material, and in which a matrix array of active circuit elements is formed in said uppermost semiconductor layer, said active circuit elements respectively functioning as control elements for corresponding display elements of said liquid crystal display panel.

21. An integrated circuit according to claim 3, and further comprising an acoustic surface wave element layer having at least one elastic surface wave element formed therein to function as an intermediate frequency filter, with input and output terminals of said acoustic surface wave element being respectively coupled to an output terminal of said tuner circuit and an input terminal of said intermediate frequency amplifier circuit.

22. An integrated circuit according to claim 21, in which said acoustic surface wave element layer comprises a thin layer of piezoelectric material of specifically determined thickness formed upon a layer of non-piezoelectric material.

23. An integrated circuit according to claim 21, in which said acoustic surface wave element layer comprises a thin layer of piezoelectric material of specifically determined thickness formed upon a substrate composed of non-piezoelectric material.

24. An integrated circuit according to claim 22 in which said piezoelectric material is selected from a group of materials which includes aluminum nitride and zinc oxide, and in which said non-piezoelectric material is silicon.

25. An integrated circuit according to claim 21, in which said acoustic surface wave element layer is formed between said tuner circuit semiconductor layer and said video and audio signal processing circuit semiconductor layer.

26. An integrated circuit according to claim 21, in which said acoustic surface wave element layer is formed upon said substrate and in which said tuner circuit semiconductor layer is formed upon said acoustic surface wave element layer.

27. An integrated circuit according to claim 2, in which said shield layer is constituted by a layer of a semiconductor material having a substantially high density of carriers.

28. An integrated circuit according to claim 2, in which said shield layer is constituted by a layer of a metal.

29. An integrated circuit according to claim 28, in which said metal is selected from a group which includes molybdenum and tungsten.

30. An integrated circuit according to claim 2, in which said shield layer is constituted by a layer of a silicide compound.

31. An integrated circuit according to claim 30, in which said silicide compound is molybdenum silicide.

32. An integrated circuit according to claim 22 and further comprising a layer of quartz formed between said layer of piezoelectric material and said non-piezoelectric material.

* * * * *